United States Patent [19]

Torimaru

[11] Patent Number: 5,347,483
[45] Date of Patent: Sep. 13, 1994

[54] NON-VOLATILE ASSOCIATIVE MEMORY WITH LOW TRANSISTOR COUNT

[75] Inventor: Yasuo Torimaru, Nara, Japan

[73] Assignee: Sharp Kabushiki Kaisha, Osaka, Japan

[21] Appl. No.: 27,132

[22] Filed: Mar. 5, 1993

[30] Foreign Application Priority Data

Mar. 6, 1992 [JP] Japan ................................ 4-49874

[51] Int. Cl.$^5$ .............................................. G11C 15/00
[52] U.S. Cl. ..................................... 365/49; 365/154; 365/185; 365/189.01
[58] Field of Search ................. 365/49, 154, 190, 185, 365/189.07, 182, 189.01

[56] References Cited

U.S. PATENT DOCUMENTS

| 4,460,978 | 7/1984 | Jiang et al. | 365/154 |
| 5,051,948 | 9/1991 | Watabe et al. | 365/49 |

FOREIGN PATENT DOCUMENTS

| 63-266697 | 11/1988 | Japan . |
| 1-184790 | 7/1989 | Japan . |
| 1-192089 | 8/1989 | Japan . |
| 1-194196 | 8/1989 | Japan . |
| 1-307095 | 12/1989 | Japan . |
| 2-35690 | 2/1990 | Japan . |
| 2-78098 | 3/1990 | Japan . |

OTHER PUBLICATIONS

Carr, W. N. et al., MOS/LSI Design and Application Texas Instrument Electronics Series, Holliday Lithograph Corp. (1972) pp. 222–225.

Primary Examiner—Eugene R. LaRoche
Assistant Examiner—Vu Le
Attorney, Agent, or Firm—Morrison & Foerster

[57] ABSTRACT

A non-volatile memory cell is disclosed. The non-volatile memory cell includes first and second selecting transistors, first and second non-volatile memory transistors for storing data in a non-volatile manner, and first and second output transistors. A gate of the first selecting transistor and a gate of the second selecting transistor are connected to a word line. A drain of the first selecting transistor is connected to a first bit line, and a drain of the second selecting transistor is connected to a second bit line. A drain of the first non-volatile memory transistor is connected to a source of the first selecting transistor. A drain of the second non-volatile memory transistor is connected to a source of the second selecting transistor. A source of the first non-volatile memory transistor and a source of the second non-volatile memory transistor are connected to a source line. A gate of the first non-volatile memory transistor and a gate of the second non-volatile memory transistor are connected to a control gate line. A drain of the first output transistor and a drain of the second output transistor are connected to a first output line. A source of the first output transistor and a source of the second output transistor are connected to a second output line. A gate of the first output transistor is connected to a drain of the first non-volatile memory transistor. A gate of the second output transistor is connected to a drain of the second non-volatile memory transistor.

8 Claims, 5 Drawing Sheets

S: L, W: H

| REFERENCE DATA | | B | B̄ | Q1 | Q2 | Q3 | Q4 | Q5 | Q6 | BETWEEN R1 - R2 |
|---|---|---|---|---|---|---|---|---|---|---|
| MEMORY CELL STATE "1" | "1" | H | L | ON | OFF | ON | ON | ON | OFF | CONDUCTIVE |
| | "0" | L | H | ON | OFF | ON | ON | OFF | OFF | NONCONDUCTIVE |
| MEMORY CELL STATE "0" | "1" | H | L | ON | ON | OFF | ON | OFF | OFF | NONCONDUCTIVE |
| | "0" | L | H | ON | ON | OFF | ON | OFF | ON | CONDUCTIVE |

FIG. 4

(REFERENCE DATA IS INTERNALLY INVERTED)   S : L, W : H

| | REFERENCE DATA | B | $\overline{B}$ | $Q_1$ | $Q_2$ | $Q_3$ | $Q_4$ | $Q_5$ | $Q_6$ | BETWEEN $R_1 - R_2$ |
|---|---|---|---|---|---|---|---|---|---|---|
| MEMORY CELL STATE "1" | "1" | L | H | ON | OFF | ON | ON | OFF | OFF | NONCONDUCTIVE |
| | "0" | H | L | ON | OFF | ON | ON | ON | OFF | CONDUCTIVE |
| MEMORY CELL STATE "0" | "1" | L | H | ON | ON | OFF | ON | OFF | ON | CONDUCTIVE |
| | "0" | H | L | ON | ON | OFF | ON | OFF | OFF | NONCONDUCTIVE |

FIG. 6

NON-VOLATILE ASSOCIATIVE MEMORY WITH LOW TRANSISTOR COUNT

BACKGROUND OF THE INVENTION

1. Field of the Invention

The present invention relates to an associative memory (i.e., a memory in which all words are internally searched in parallel fashion) for which wide applications are recently expected in the information processing field, and more particularly relates to a non-volatile associative memory.

2. Description of the Related Art

FIG. 8 shows an exemplary conventional associative memory which is described in "MOS/LSI Design and Application" by W. N. Carr, J. P. Mize, pp. 222-225. In this associative memory, each memory cell includes ten transistors $T_1$-$T_8$, $T_{L1}$ and $T_{L2}$. The transistors $T_1$-$T_4$, $T_{L1}$ and $T_{L2}$ constitute a static RAM (random access memory), so that usual read/write operations can be performed.

An associative memory action is performed in such a manner that the transistors $T_5$-$T_8$ provide an exclusive-OR logic function between the voltage of the bit lines $B(0)$ and $B(1)$ and the node voltages $Q$ and $\overline{Q}$ of a memory cell. For example, in the case where a search is made for data "1" while data "0" is stored in the memory cell, the transistors $T_6$ and $T_8$ are both conducting (positive logic). In another case where a search is made for data "0" while data "1" is stored in the memory cell, the transistors $T_5$ and $T_7$ are both conducting.

With the above configuration, if the contents of the memory cell do not match the contents of data to be searched, either the path containing transistors $T_6$ and $T_8$ or the path containing transistors $T_5$ and $T_7$ are conducting, which provides a conduction path from a voltage line $V_H$ to a word line W in FIG. 8. Thus, a current $I_M$ flows through a resistor R. On the contrary, if the contents of the memory cell match the contents of data to be searched, neither of the path containing transistors $T_6$ and $T_8$ nor the path containing transistors $T_5$ and $T_7$ are conducting, so that no current flows through the resistor R. Therefore, the matching of the data contents stored in the memory cell with the contents of data to be searched is performed by detecting the presence or absence of the current $I_M$ flowing through the resistor R.

As described above, the associative memory can perform the matching of the data contents stored in memory cells which are arranged along the word line W with the reference data contents in the parallel fashion, whereby the processing speed can be improved. Due to such an advantage, associative memories are applied in various fields such as pattern recognition.

However, the above-described conventional associative memory has the following drawbacks:

(1) since a single memory cell is constituted by ten transistors, the size per unit memory cell is large, whereby the associative memory is not suitable for a large capacity type; and (2) since the associative memory is not provided with means for forming a backup of the data stored in a memory cell, the contents of the memory cell will volatilize when the voltage supply is turned OFF.

SUMMARY OF THE INVENTION

The non-volatile memory cell of this invention includes: first and second selecting transistors, a gate of the first selecting transistor and a gate of the second selecting transistor being connected to a word line, a drain of the first selecting transistor being connected to a first bit line, a drain of the second selecting transistor being connected to a second bit line; first and second non-volatile memory transistors for storing data in a non-volatile manner, a drain of the first non-volatile memory transistor being connected to a source of the first selecting transistor, a drain of the second non-volatile memory transistor being connected to a source of the second selecting transistor, a source of the first non-volatile memory transistor and a source of the second non-volatile memory transistor being connected to a source line, a gate of the first non-volatile memory transistor and a gate of the second non-volatile memory transistor being connected to a control gate line; and first and second output transistors, a drain of the first output transistor and a drain of the second output transistor being connected to a first output line, a source of the first output transistor and a source of the second output transistor being connected to a second output line, a gate of the first output transistor being connected to a drain of the first non-volatile memory transistor, a gate of the second output transistor being connected to a drain of the second non-volatile memory transistor.

In another aspect of the invention, a non-volatile associative memory device including a plurality of memory cells is provided. Each of the memory cells includes: first and second selecting transistors, a gate of the first selecting transistor and a gate of the second selecting transistor being connected to a word line, a drain of the first selecting transistor being connected to a first bit line, a drain of the second selecting transistor being connected to a second bit line; first and second non-volatile memory transistors for storing data in a non-volatile manner, a drain of the first non-volatile memory transistor being connected to a source of the first selecting transistor, a drain of the second non-volatile memory transistor being connected to a source of the second selecting transistor, a source of the first non-volatile memory transistor and a source of the second non-volatile memory transistor being connected to a source line, a gate of the first non-volatile memory transistor and a gate of the second non-volatile memory transistor being connected to a control gate line; and first and second output transistors, a drain of the first output transistor and a drain of the second output transistor being connected to a first output line, a source of the first output transistor and a source of the second output transistor being connected to a second output line, a gate of the first output transistor being connected to a drain of the first non-volatile memory transistor, a gate of the second output transistor being connected to a drain of the second non-volatile memory transistor.

Hereinafter, write/erase processes to memory cells and a matching process for matching the contents of memory cells with reference data in the non-volatile associative memory having the above configuration will be described. In this associative memory, a non-volatile memory transistor is of the floating gate type.

First, the erase process is performed in the following manner. Predetermined voltages are applied to a common control gate line to which control gates of non-volatile memory transistors are connected, a word line to which gates of selecting transistors are connected, and a common source line, respectively. By this voltage application, electrons on floating gates of the non-volatile memory transistors are ejected into sources. Thus, the stored data is erased.

The write process of data "1" or data "0" is performed in the following manner. Predetermined voltages are applied to two bit lines to which drains of the selecting transistors are respectively and separately connected, the common control gate line, the word line and the common source line, respectively. By this voltage application, electrons are injected into the floating gate of either one of the non-volatile memory transistors depending on the data "1" or "0" to be written. Thus, the data is written.

The matching process is briefly described. For example, if the data stored in the non-volatile memory transistor match the reference data, a conduction path is formed between two common output lines which are respectively connected to output transistors. If the stored data and the reference data do not match, the conduction path is not formed between the two common output lines.

Therefore, in an exemplary configuration in which a plurality of memory cells are arranged along a word line, and connected in series via two common output lines, the data of all the memory cells will be matched in a parallel fashion. If the match is perfect for all the memory cells, for example, "0" is output as a reference result output. If there is a mismatch even for one memory cell, "1" is output. That is, the matching operation for determining whether the data of memory cells match the reference data or not is performed in parallel fashion and at a high speed.

Thus, the invention described herein makes possible the advantage of providing a non-volatile associative memory in which the size per unit memory cell can be made smaller and consequentially the capacity of the associative memory can be made larger and the production cost thereof can be lowered, and in which the data contents of the memory cells will not be volatilized when the voltage supply is turned OFF.

This and other advantages of the present invention will become apparent to those skilled in the art upon reading and understanding the following detailed description with reference to the accompanying figures.

BRIEF DESCRIPTION OF THE DRAWINGS

FIG. 4 is a diagram showing the matching results of the memory cell states with reference data;

FIG. 6 is a diagram showing the matching results in a modified example of an associative memory of the present invention, in the same manner as in FIG. 4;

DESCRIPTION OF THE PREFERRED EMBODIMENTS

Figures 1, 2, 3:
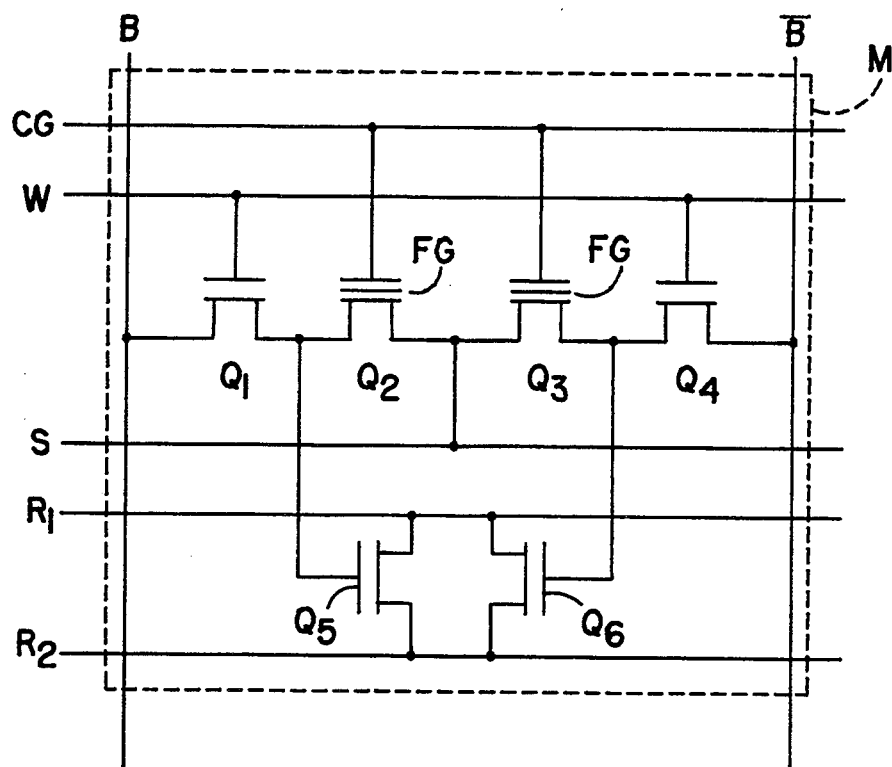
FIG. 1 is a circuit diagram showing a memory cell in a non-volatile associative memory according to the present invention.
FIG. 2 is a diagram illustrating relationships between applied voltages and write/erase operations to the memory cell in the non-volatile associative memory according to the present invention.
FIG. 3 is a diagram illustrating relationships between written states of the memory cell and threshold voltages of non-volatile memory transistors.

FIG. 1 shows a circuit configuration of a memory cell in a non-volatile associative memory according to the present invention. In the non-volatile associative memory, each memory cell includes six transistors $Q_1$, $Q_2$, $Q_3$, $Q_4$, $Q_5$, and $Q_6$. The transistors $Q_1$, $Q_4$, $Q_5$, and $Q_6$ are N-channel MOS transistors. The transistors $Q_2$ and $Q_3$ are N-channel non-volatile memory transistors in which the stored data will not volatilize. In this example, the N-channel non-volatile memory transistors are of conventional floating gate type.

Gates of the transistors $Q_1$ and $Q_4$ are connected to a word line W. A drain of the transistor $Q_1$ is connected to a bit line B. A drain of the transistor $Q_4$ is connected to a bit line $\overline{B}$. Accordingly, the transistors $Q_1$ and $Q_4$ function as selecting transistors for selecting a memory cell M.

In addition, a source of the transistor $Q_1$ is connected to a drain of the non-volatile memory transistor $Q_2$. A source of the transistor $Q_4$ is connected to a drain of the non-volatile memory transistor $Q_3$. Sources of the non-volatile memory transistors $Q_2$ and $Q_3$ are respectively connected to a common source line S. Gates of the non-volatile memory transistors $Q_2$ and $Q_3$ are respectively connected to a common control gate line CG. Moreover, drains of the non-volatile memory transistors $Q_2$ and $Q_3$ are respectively connected to gates of the transistors $Q_5$ and $Q_6$. Drains and sources of the transistors $Q_5$ and $Q_6$ are connected to common output lines $R_1$ and $R_2$, respectively.

Referring to FIGS. 2 and 3, write/erase operations to the non-volatile memory transistors $Q_2$ and $Q_3$ are described. First, the erase operation is described. As is shown in FIG. 2, in the erase operation, voltages of $-12$ V, 0 V, and 5 V are applied to the common control gate line CG, the word line W and the common source line S, respectively. By the voltage application, electrons on floating gates FG of the non-volatile memory transistors $Q_2$ and $Q_3$ are ejected into the sources, whereby the stored data is erased.

Next, the write operation of data "1" is described. As is shown in FIG. 2, in this case, voltages of 5 V, 0 V, 12 V, 7 V, and 0 V are applied to the bit line B, the bit line $\overline{B}$, the common control gate line CG, the word line W, and the common source line S, respectively. By the voltage application, electrons are injected to the floating gate FG of the non-volatile memory transistor $Q_2$. At this time, the state of the non-volatile memory transistor $Q_3$ is not changed. As a result, in the written state of data "1", as is shown in FIG. 3, the threshold voltage $V_{th}$ of the non-volatile memory transistor $Q_2$ becomes high, while the threshold voltage $V_{th}$ of the non-volatile memory transistor $Q_3$ remains low.

Next, the write operation of data "0" is described. As is shown in FIG. 2, in this case, voltages of 0 V, 5 V, 12 V, 7 V, and 0 V are applied to the bit line B, the bit line $\overline{B}$, the common control gate line CG, the word line W, and the common source line S, respectively. By the voltage application, electrons are injected into the floating gate FG of the non-volatile memory transistor $Q_3$. At this time, the state of the non-volatile memory transistor $Q_2$ is not changed. As a result, in the written state of data "0", as is shown in FIG. 3, the threshold voltage $V_{th}$ of the non-volatile memory transistor $Q_3$ becomes high, while the threshold voltage $V_{th}$ of the non-volatile memory transistor $Q_2$ remains low, which is different from the written state of data "1".

Next, how the matching of a state of the memory cell M with reference (search) data is performed is described with reference to FIG. 4. During the matching, the common source line S is set to be "L" level (=0 V), and the word line W is set to be "H" level (=7 V).

First, assume a case where the memory cell M is in the written state of data "1", and the reference data is "1", i.e., a case where the stored data matches the reference data. In this case, the bit line B is precharged to an "H" level, and the bit line $\overline{B}$ is at an "L" level. Accordingly, under these conditions, the transistors $Q_1$, $Q_4$ and $Q_5$ and the non-volatile memory transistor $Q_3$ are in the ON state, and the non-volatile memory transistor $Q_2$ and the transistor $Q_6$ are in the OFF state, whereby a conduction path is formed between the common output lines $R_1$ and $R_2$.

In another case, the memory cell M is in the written state of data "1", and the reference data is "0", a case where the stored data and the reference data do not match. In this case, the bit line $\overline{B}$ is precharged to an "H" level, and the bit line B is at an "L" level. Accordingly, under these conditions, the transistors $Q_1$ and $Q_4$ and the non-volatile memory transistor $Q_3$ are in the ON state, and the non-volatile transistor $Q_2$ and the transistors $Q_5$ and $Q_6$ are in the OFF state, so the conduction path is not formed between the common output lines $R_1$ and $R_2$.

In yet another case, the memory cell M is in the written state of data "0", and the reference data is "1", i.e., a case where the stored data and the reference data do not match. In this case, the bit line B is precharged to the "H" level, and the bit line $\overline{B}$ is at the "L" level. Accordingly, under these conditions, the transistors $Q_1$ and $Q_4$ and the non-volatile memory transistor $Q_2$ are in the ON state, and the non-volatile memory transistor $Q_3$ and the transistors $Q_5$ and $Q_6$ are in the OFF state, so the conduction path is not formed between the common output lines $R_1$ and $R_2$.

In a fourth case, the memory cell M is in the written state of data "0", and the reference data is "0", i.e., a case where the stored data matches the reference data. In this case, the bit line $\overline{B}$ is precharged to the "H" level, and the bit line B is at the "L" level. Accordingly, under these conditions, the transistors $Q_1$, $Q_4$ and $Q_6$ and the non-volatile memory transistor $Q_2$ are in the ON state, and the non-volatile transistor $Q_3$ and the transistor $Q_5$ are in the OFF state, whereby the conduction path is formed between the common output lines $R_1$ and $R_2$.

As apparent from the above description and FIG. 4 showing the matching results, in the non-volatile associative memory of the invention, if the written state of the memory cell M matches the reference data, a conduction path is formed between the common output lines $R_1$ and $R_2$. If the written state and the reference data do not match, the conduction path is not formed between the common output lines $R_1$ and $R_2$.

Figure 5:
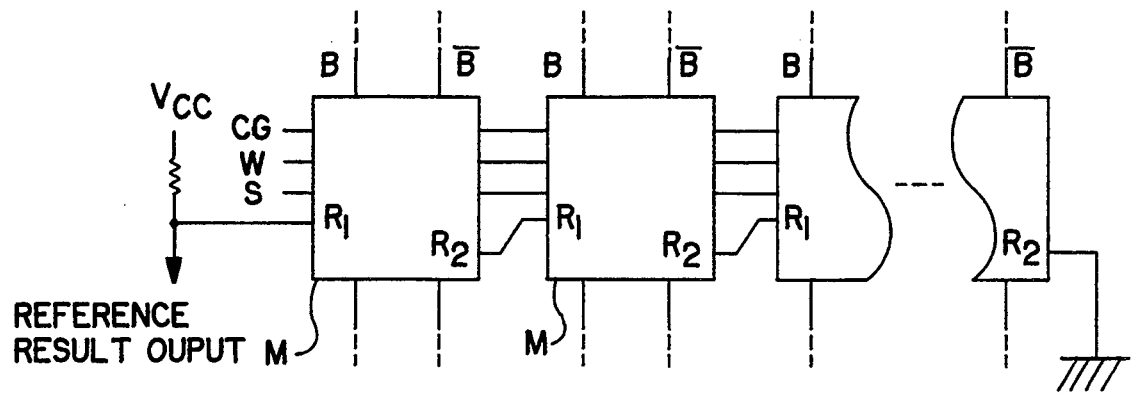
FIG. 5 is a circuit diagram showing the connection of a plurality of memory cells in the associative memory of the present invention corresponding to the matching results shown in FIG. 4.

As is shown in FIG. 5, a plurality of memory cells M are arranged into a line, and connected in a series manner via the common output lines $R_1$ and $R_2$. Specifically, the common output line $R_2$ of each memory cell is connected to the common output lines $R_1$ of adjacent memory cells. The common output line $R_1$ of the memory cell disposed at one end is connected to a supply voltage $V_{CC}$. The common output line $R_2$ of the memory cell disposed at the other end is grounded. With the above configuration, the data of all memory cells M can be matched in a parallel fashion. Only when the match is perfect for all the memory cells, "0" is output as the reference result output. When there is a mismatch even for a single memory cell, "1" is output as the reference result output. As described above, according to the associative memory of the present invention, the matching of the contents of memory cells M with the reference data can be performed in a parallel fashion, so that the matching operation can be performed at a high speed.

Figure 7:
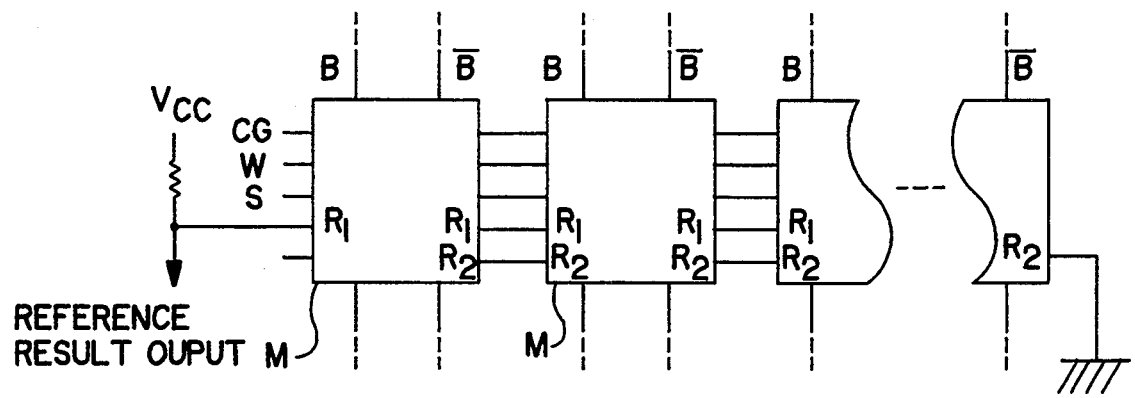
FIG. 7 is a circuit diagram showing a connection of a plurality of memory cells in the modified example of the associative memory of the present invention corresponding to the matching results shown in FIG. 6.
Figure 8:
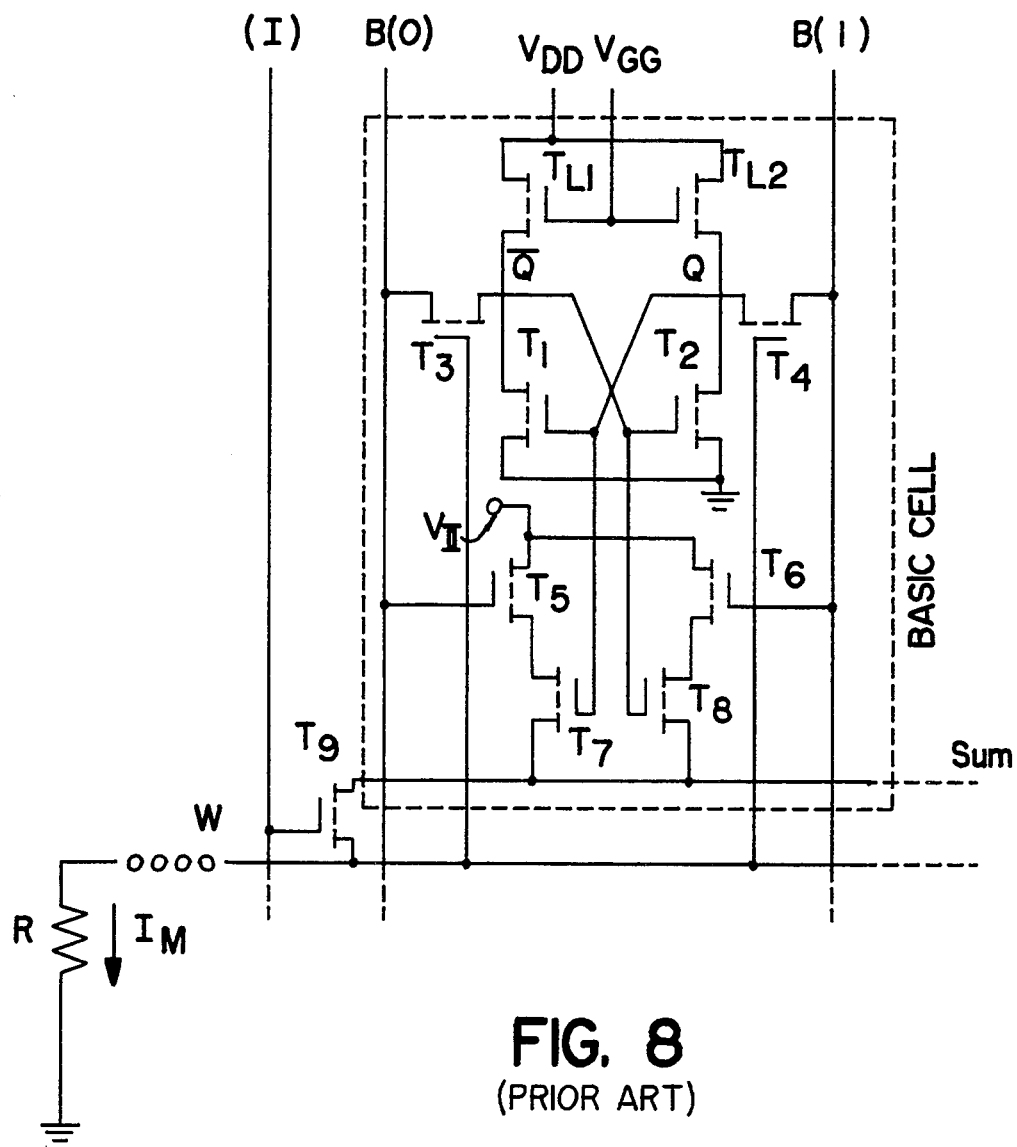
FIG. 8 is a circuit diagram showing a memory cell in an associative memory of the prior art.

FIGS. 6 and 7 show a modified example of a non-volatile associative memory of the present invention. In this modified example, the reference data is inverted in the non-volatile associative memory and then the matching is performed with respect to the inverted reference data. In this modified example, since the reference data is applied after it is inverted, unlike the above example, when the written state of the memory cell M matches the reference data, the conduction path is not formed between the common output lines $R_1$ and $R_2$. When the written state of the memory cell M does not match the reference data, the conduction path is formed therebetween.

FIG. 6 shows the matching result in the modified example, and FIG. 7 shows the connection of a plurality of memory cells. As is shown in FIG. 7, in this modified example, the common output lines $R_1$ of the respective memory cells M are connected to each other and the common output lines $R_2$ are also connected to each other. As a result, a plurality of memory cells M are connected in a parallel manner via the common output lines $R_1$ and $R_2$. Specifically, the common output line $R_1$ of each memory cell is connected to the common output lines $R_1$ of the adjacent memory cells. The common output line $R_2$ of each memory cell is connected to the common output lines $R_2$ of adjacent memory cells. The common output line $R_1$ of the memory cell is connected to a supply voltage $V_{CC}$. The common output line $R_2$ of the memory cell is grounded.

Therefore, according to this modified example, if the match is perfect for all the memory cells M, "1" is output as the reference result output. If there is a mismatch even for a single memory cell M, the conduction path is formed between the common output lines $R_1$ and $R_2$, but a magnitude of the current is increased in proportion to the number of mismatch memory cells M. As a result, the level of the output voltage is lowered in accordance with the number of the memory cells M which do not match the reference data. Therefore, according to the modified example, by detecting the voltage level of the reference result output, the matching degree can be detected.

As described above, according to the non-volatile associative memory of the present invention, a single memory cell includes two selecting transistors for selecting the memory cell, two non-volatile memory transistors for storing data in a non-volatile manner, and two output transistors for outputting data. Accordingly, the size per unit memory cell can be remarkably reduced as compared with a memory cell including ten transistors in the conventional associative memory. Therefore, according to the non-volatile associative memory of the invention, the capacity of the associative memory can be increased and the associative memory can be produced at a much lower cost.

Moreover, since the non-volatile memory transistors are provided as data storing means, data in the memory cell will not volatilize even when the voltage supply is turned OFF.

According to the modified example of the non-volatile associative memory, the matching operation of the contents of the memory cells with the reference data can be performed in a parallel fashion and at a high speed. Moreover, the matching degree can be detected.

For the above reasons, the non-volatile associative memory of the present invention is extremely useful industrially, because it is applicable to the pattern recognition field or the like.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A non-volatile memory cell comprising:
   first and second selecting transistors, a gate of said first selecting transistor and a gate of said second selecting transistor being connected to a word line, a drain of said first selecting transistor being connected to a first bit line, a drain of said second selecting transistor being connected to a second bit line;
   first and second non-volatile memory transistors for storing data in a non-volatile manner, a drain of said first non-volatile memory transistor being connected to a source of said first selecting transistor, a drain of said second non-volatile memory transistor being connected to a source of said second selecting transistor, a source of said first non-volatile memory transistor and a source of said second non-volatile memory transistor being connected to a source line, a gate of said first non-volatile memory transistor and a gate of said second non-volatile memory transistor being connected to a control gate line; and
   first and second output transistors, a drain of said first output transistor and a drain of said second output transistor being directly connected to a first output line, a source of said first output transistor and a source of said second output transistor being directly connected to a second output line, a gate of said first output transistor being connected to a drain of said first non-volatile memory transistor, a gate of said second output transistor being connected to a drain of said second non-volatile memory transistor.

2. A non-volatile memory cell according to claim 1, wherein said first and second non-volatile memory transistors are N-channel non-volatile memory transistors of floating gate type.

3. A non-volatile associative memory device including a plurality of memory cells, each of said memory cells comprising:
   first and second selecting transistors, a gate of said first selecting transistor and a gate of said second selecting transistor being connected to a word line, a drain of said first selecting transistor being connected to a first bit line, a drain of said second selecting transistor being connected to a second bit line;
   first and second non-volatile memory transistors for storing data in a non-volatile manner, a drain of said first non-volatile memory transistor being connected to a source of said first selecting transistor, a drain of said second non-volatile memory transistor being connected to a source of said second selecting transistor, a source of said first non-volatile memory transistor and a source of said second non-volatile memory transistor being connected to a source line, a gate of said first non-volatile memory transistor and a gate of said second non-volatile memory transistor being connected to a control gate line; and
   first and second output transistors, a drain of said first output transistor and a drain of said second output transistor being directly connected to a first output line, a source of said first output transistor and a source of said second output transistor being directly connected to a second output line, a gate of said first output transistor being connected to a drain of said first non-volatile memory transistor, a gate of said second output transistor being connected to a drain of said second non-volatile memory transistor.

4. A non-volatile associative memory device including a plurality of memory cells, each of said memory cells comprising:
   first and second selecting transistors, a gate of said first selecting transistor and a gate of said second selecting transistor being connected to a word line, a drain of said first selecting transistor being connected to a first bit line, a drain of said second selecting transistor being connected to a second bit line;
   first and second non-volatile memory transistors for storing data in a non-volatile manner, a drain of said first non-volatile memory transistor being connected to a source of said first selecting transistor, a drain of said second non-volatile memory transistor being connected to a source of said second selecting transistor, a source of said first non-volatile memory transistor and a source of said second non-volatile memory transistor being connected to a source line, a gate of said first non-volatile memory transistor and a gate of said second non-volatile memory transistor being connected to a control gate line; and
   first and second output transistors, a drain of said first output transistor and a drain of said second output transistor being connected to a first output line, a source of said first output transistor and a source of said second output transistor being connected to a second output line, a gate of said first output transistor being connected to a drain of said first non-volatile memory transistor, a gate of said second output transistor being connected to a drain of said second non-volatile memory transistor,
   wherein said memory cells are connected in series via said first and second output lines.

5. A non-volatile associative memory device according to claim 3, wherein said memory cells are connected in parallel via said first and second output lines.

6. A non-volatile associative memory device according to claim 4, wherein said first and second non-volatile memory transistors are N-channel non-volatile memory transistors of a floating gate type.

7. A non-volatile associative memory device according to claim 4, wherein said first and second selecting transistors, said first and second non-volatile memory transistors, and said first and second output transistors have a same type polarity.

8. A non-volatile associative memory device according to claim 7, wherein said first and second selecting transistors, said first and second non-volatile memory transistors, and said first and second output transistors are each N-channel transistors.

* * * * *